(12) United States Patent
Navarro et al.

(10) Patent No.: US 11,101,430 B2
(45) Date of Patent: Aug. 24, 2021

(54) STORAGE ELEMENT

(71) Applicant: Commissariat à l'Énergie Atomique et aux Énergies Alternatives, Paris (FR)

(72) Inventors: Gabriele Navarro, Grenoble (FR); Mathieu Bernard, Grenoble (FR); Marie-Claire Cyrille, Grenoble (FR); Chiara Sabbione, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/531,345

(22) Filed: Aug. 5, 2019

(65) Prior Publication Data

US 2020/0052197 A1 Feb. 13, 2020

(30) Foreign Application Priority Data

Aug. 8, 2018 (FR) ...................................... 1857391

(51) Int. Cl.
*H01L 45/00* (2006.01)
*G11C 13/00* (2006.01)
*H01L 27/24* (2006.01)

(52) U.S. Cl.
CPC .......... *H01L 45/06* (2013.01); *G11C 13/0004* (2013.01); *H01L 27/24* (2013.01); *H01L 45/144* (2013.01); *H01L 45/148* (2013.01); *H01L 45/1641* (2013.01)

(58) Field of Classification Search
CPC ..... G11C 13/0004; H01L 27/24; H01L 45/06; H01L 45/1233; H01L 45/126; H01L 45/144; H01L 45/148; H01L 45/16; H01L 45/1608; H01L 45/1641
See application file for complete search history.

(56) References Cited

U.S. PATENT DOCUMENTS

| | | | |
|---|---|---|---|
| 2004/0113137 A1* | 6/2004 | Lowrey | H01L 27/2427 257/5 |
| 2004/0188735 A1* | 9/2004 | Hideki | H01L 45/1625 257/295 |
| 2009/0020744 A1* | 1/2009 | Mizukami | H01L 21/76831 257/4 |
| 2009/0237983 A1 | 9/2009 | Happ et al. | |
| 2010/0096609 A1 | 4/2010 | Kim et al. | |
| 2016/0056171 A1* | 2/2016 | Manorotkul | H01L 21/02532 257/66 |
| 2017/0263863 A1 | 9/2017 | Lung et al. | |

(Continued)

FOREIGN PATENT DOCUMENTS

CN 105870323 A1 8/2016

OTHER PUBLICATIONS

Preliminary Search Report for French Application No. 1857391, dated Apr. 26, 2019.

(Continued)

*Primary Examiner* — Allan R Wilson
(74) *Attorney, Agent, or Firm* — Wolf, Greenfield & Sacks, P.C.

(57) ABSTRACT

A phase-change storage element including, in a first portion, a stack of amorphous layers, the thickness of each layer in the stack being smaller than or equal to 5 nm.

16 Claims, 4 Drawing Sheets

(56) References Cited

U.S. PATENT DOCUMENTS

2017/0309819 A1* 10/2017 Wu .................... G11C 13/0023

OTHER PUBLICATIONS

Pakala et al., Materials and Processes for Emerging Memories. 2018 IEEE International Memory Workshop (IMW). May 13-16, 2018:1-4.

Hu et al., $Ge_2Sb_2Te_5$/Sb superlattice-like thin film for high speed phase change memory application. Applied Physics Letters. Dec. 28, 2015;107(26):263105-1-5.

Hu et al., Superlattice-like $Ge_2SB_{92}$/Ge thin films for high speed and low power consumption phase change memory application. Scripta Materialia. Dec. 15, 2014;93:4-7.

* cited by examiner

STORAGE ELEMENT

This application claims the priority benefit of French patent application number 18/57391, the content of which is hereby incorporated by reference in its entirety to the maximum extent allowable by law.

TECHNICAL BACKGROUND

The present disclosure generally concerns storage elements and more particularly phase-change storage elements.

DISCUSSION OF THE RELATED ART

Phase-change materials are materials that can switch, under the effect of heat, between a crystalline phase and an amorphous phase. Since the electric resistance of an amorphous material is significantly greater than the electric resistance of a crystalline material, such a phenomenon may be useful to define two memory states, for example, 0 and 1, differentiated by the resistance measured through the phase-change material.

The decrease of the dimensions of phase-change storage elements, and more particularly the decrease of the thickness of the layer of phase-change material and of the volume of phase-change material may cause an increase in the crystallization temperature and an increase in the thermal stability of the material in the amorphous phase.

The most common phase-change materials in storage elements are alloys made up of germanium, of antimony, and of tellurium. Such alloys generally have stoichiometric proportions. Alloys having non-stoichiometric proportions may be preferred to alloys having stoichiometric proportions since they may have desired characteristics, for example, a higher crystallization temperature. However, the manufacturing of storage elements comprising such alloys has various disadvantages. Particularly, the crystallization of such alloys and/or the phase separation may cause a lack of homogeneity of the alloy, which may cause an efficiency decrease.

SUMMARY

An embodiment overcomes all or part of the disadvantages of known storage elements.

An embodiment provides a phase-change storage element comprising, in a first portion, a stack of amorphous layers, the thickness of each layer in the stack being smaller than or equal to 5 nm.

According to an embodiment, the stack comprises at least two assemblies of layers made of different materials.

According to an embodiment, the layers in the stack are made of a chemical element or of an alloy of chemical elements from groups 13, 14, 15, and 16 of the periodic table of elements.

According to an embodiment, the stack comprises an alternation of first and of second layers, the first and second layers being made of different materials.

According to an embodiment, the first layers are made of an alloy based on germanium, of antimony, and of tellurium, and the second layers are made of antimony or of germanium.

According to an embodiment, the material of each layer in the stack has stoichiometric proportions.

According to an embodiment, the element comprises a second portion crossing at least certain layers in the stack, made of an alloy of at least part of the components of the layers in the stack.

According to an embodiment, the proportions of the material of the second portion are not stoichiometric.

According to an embodiment, the first and second portions are separated by a skin made of a material of one of the layers in the stack.

According to an embodiment, the element comprises a resistive element in contact with the second portion.

According to an embodiment, the material of the second portion is a phase-change material.

According to an embodiment, layers of an assembly of layers of the stack are doped.

According to an embodiment, the layers of the assembly of layers are doped with one or a plurality of dopants among nitrogen, carbon, and silicon.

According to an embodiment, the doping of the layers of the assembly of layers is gradual.

An embodiment provides a phase-change memory cell comprising a storage element such as previously described.

An embodiment provides a method of manufacturing a storage element comprising forming a stack of amorphous layers, the thickness of each layer being smaller than or equal to 5 nm.

According to an embodiment, the method comprises a step of heating a portion of the stack, so that the portion comprises an alloy of at least part of the components of the layers in the stack.

BRIEF DESCRIPTION OF THE DRAWINGS

The foregoing and other features and advantages will be discussed in detail in the following non-limiting description of specific embodiments in connection with the accompanying drawings.

DESCRIPTION OF THE EMBODIMENTS

Figure 1:
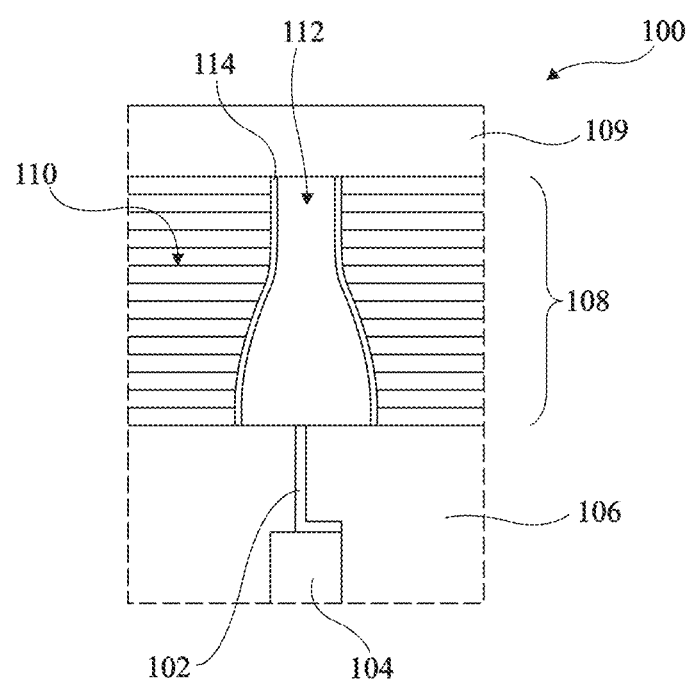
FIG. 1 is a partial simplified cross-section view of an embodiment of a storage element.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the memory cells comprise elements, for example, selection elements, for example, transistors or electric connections, which will not be detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", "approximately", and "in the order of" are used herein to designate a tolerance of plus or minus 10%, preferably of plus or minus 5%, of the value in question.

FIG. 1 is a partial simplified cross-section view of an embodiment of a storage element 100. Storage element 100 is for example comprised within a phase-change memory cell.

Storage element 100 comprises a resistive element 102 connected to a selection element, for example, a transistor, not shown, via a conductive via 104. Resistive element 102 for example has an L-shaped cross-section having its horizontal portion in contact with conductive via 104. Resistive element 102 and conductive via 104 are surrounded with an insulating layer 106. The thickness of layer 106 is such that the upper surface of the vertical portion of the resistive element is coplanar with the upper surface of insulating layer 106. The selection element is located under layer 106.

Storage element 100 further comprises a region 108 resting on the upper surface of insulating layer 106 and on the upper surface of the vertical portion of resistive element 102. A conductive layer 109 rests on region 108. Conductive layer 109 forms an electrode of the storage element.

Region 108 comprises a first portion 110 and a second portion 112.

First portion 110 comprises a stack of layers, preferably all made of amorphous materials. The layers in the stack are preferably made of chemical elements, or alloys of chemical elements, from groups 13, 14, 15, or 16 of the periodic table of elements. Group 13 comprises boron, aluminum, gallium, indium, and thallium. Group 14 comprises carbon, silicon, germanium, tin, lead, and flerovium. Group 15 comprises phosphorus, arsenic, antimony, bismuth, and moscovium. Group 16 comprises sulfur, selenium, tellurium, polonium, and livermorium.

Each layer of stack 110 is made of a material preferably having stoichiometric proportions. These materials are for example materials selected from the following list: Ge2Sb2Te5, GeTe, Ge, Te, Sb, Sb2Te3, Bi2Te3, GeSe, GeS2.

Stack 110 for example alternately comprises first and second layers, the first and second layers being made of different materials.

The first layers are, for example, made of an alloy made up of germanium, antimony, and tellurium (GST), for example, Ge2Sb2Te5, and the second layers are for example made of antimony or of germanium. For example, the second layers are made of a material which is not a phase-change material.

Each of the layers of stack 110 has a thickness smaller than or equal to approximately 5 nm, for example, in the range from the atomic constant of the material of the layer to approximately 5 nm, preferably in the range from 2 to 5 nm. Preferably, each of the layers of stack 110 has a thickness smaller than approximately 5 nm, preferably smaller than 5 nm.

For example, if the stack comprises a same number of layers A and B made of different materials, the thicknesses of layers A and B are determined in the previously-discussed range by solving the following equations:

$$T = N \times (t_A + t_B) \quad \text{[Math 1]}$$

$$P_A = 100 \times \frac{t_A}{t_A + t_B} \quad \text{[Math 2]}$$

$$P_B = 100 \times \frac{t_B}{t_A + t_B} \quad \text{[Math 3]}$$

where T is the total thickness of stack 110, $t_A$ is the thickness of a layer A, $t_B$ is the thickness of a layer B, N is the number of layers A (equal to the number of layers B), $P_A$ is the proportion (in %) of the material of layers A in the general stack, $P_B$ is the proportion (in %) of the material of layers B in the general stack.

More generally, the stack comprises at least two assemblies of layers, each assembly comprising layers made of a material different from the materials of the layers of the other assemblies.

The first and second portions 110 and 112 may be separated by a skin 114 made of one of the chemical elements of stack 110. For example, if stack 110 comprises layers of GST and of antimony, skin 114 may be made of antimony.

Second portion 112, for example resulting from the fusion of layers of stack 110 as will be described hereafter, is in contact with the upper surface of layer 106 and the upper surface of the vertical portion of resistive element 102.

In the example of FIG. 1, the second portion for example extends from the upper surface of insulating layer 106 to conductive layer 109. More generally, the second portion crosses at least certain layers of stack 110.

Second portion 112 is made of an alloy of at least some of the chemical elements and/or alloys of chemical elements of the layers of stack 110. Second portion 112 is made of a phase-change material. Second portion 112 is preferably made of a material having non-stoichiometric proportions. Second portion 112 is for example made of an alloy of germanium, of antimony, and of tellurium having a germanium or antimony concentration greater than that of alloys having stoichiometric proportions.

The information written or programmed into the storage element is determined by the amorphous or crystalline state of at least a portion of second portion 112.

Figure 2:
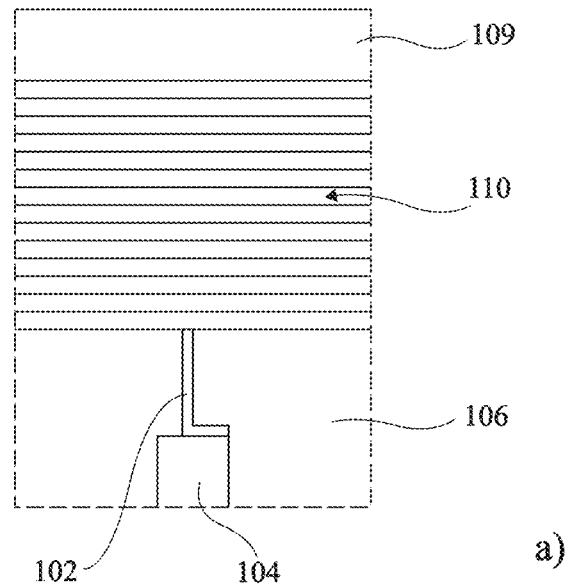
FIG. 2 schematically and partially shows structures obtained during the manufacturing of the storage element of FIG. 1.
Figure 2:
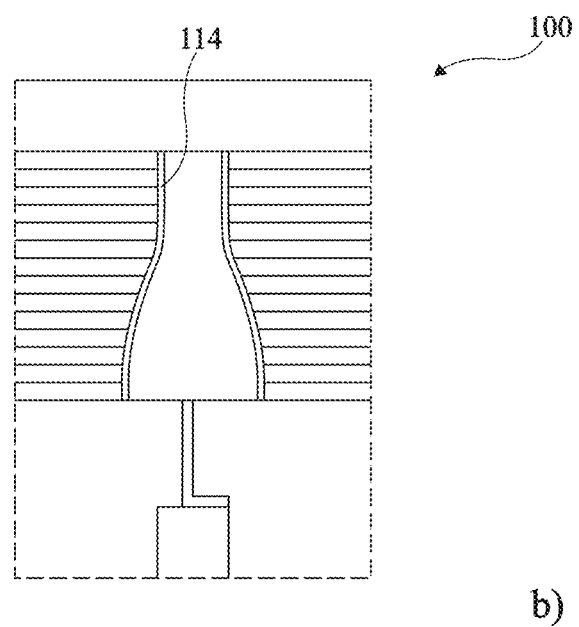

FIG. 2 schematically and partially shows two structures a) and b) obtained after two steps of manufacturing the embodiment of FIG. 1.

Structure a) is obtained after steps comprising:
the forming of the selection element, not shown;
the forming of insulating layer 106;
the forming of conductive via 104;
the forming of resistive element 102;
the forming of stack 110 on the upper surface of insulating layer 106 and on the upper surface of the vertical portion of resistive element 102. Stack 110 may comprise any number of layers, each layer having a thickness smaller than or equal to 5 nm, for example, in the range from the atomic constant of the material of the layer to approximately 5 nm; and the forming of conductive layer 109, covering the upper layer of stack 110.

The layers in the stack are for example formed one by one by physical vapor deposition (PVD).

Structure b) is obtained by heating resistive element 102 with a current flowing between conductive via 104 and conductive layer 109. The temperature of resistive element 102 then becomes sufficient for stack 110 to transit through an initialization step during which second portion 112 is made of the second alloy from the heated portions of the layers of stack. Skin 114 may form at this step.

Figure 3:
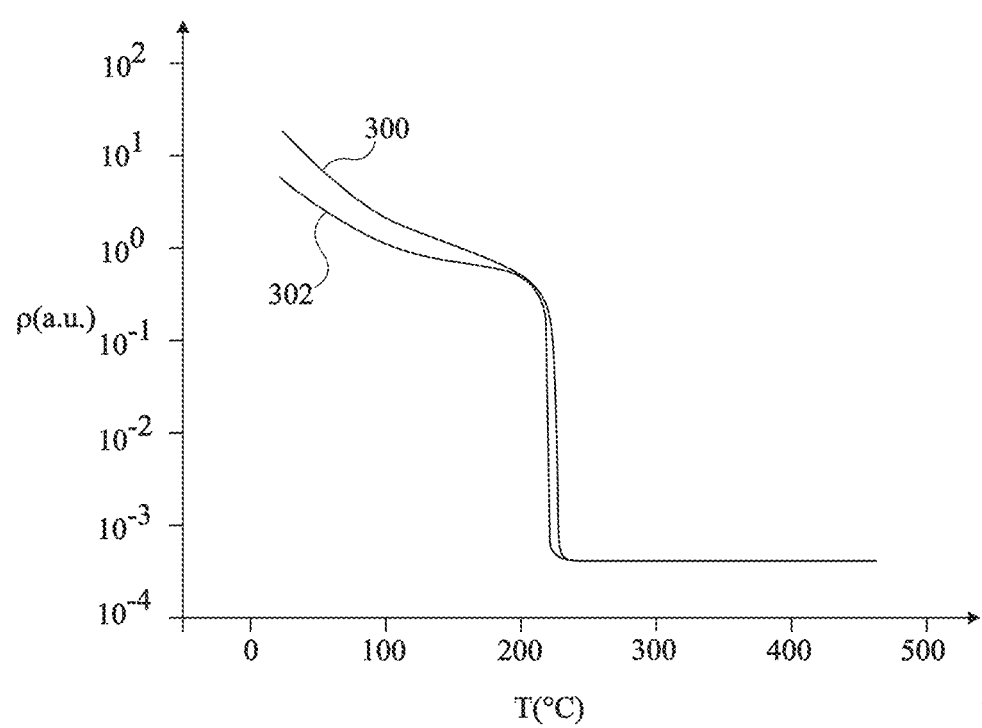
FIG. 3 shows the resistivity of two phase-change materials according to temperature.

FIG. 3 shows the resistivity (ρ(a.u.)) of two phase-change materials according to temperature (T(° C.)).

A curve 300 corresponds to the resistivity of a solid block (bulk) of an alloy made up of germanium, of antimony, and of tellurium having an antimony concentration greater than that of an alloy having stoichiometric proportions.

A curve 302 corresponds to a stack of amorphous layers such as that described in FIG. 1, comprising layers of an alloy of germanium, of antimony, and of tellurium having stoichiometric proportions and antimony layers. The stack comprises the same quantity of germanium, of antimony, and of tellurium as the bulk associated with curve 300.

It can be observed that curves 300 and 302 are similar. Thus, the bulk and the stack of layers have similar behaviors when the temperature to which are submitted increases. In particular, the temperature at which a significant and fast variation can be observed (at approximately 220° C.) and which corresponds to the crystallization temperature, is similar for the solid block and the stack of layers.

More generally, experiments have shown that, from a macroscopic point of view, that is, considering the entire stack as being a single element, the stack of layers has a behavior similar to that of the solid block.

However, the components of a bulk of an alloy having no stoichiometric proportions tend to recompose in stoichiometric elements, also called phase separation, particularly when they are submitted to the relatively high temperatures of the manufacturing processes. Such a recomposition results in a variability between storage elements which are otherwise substantially identical. The described embodiments, already comprising layers have stoichiometric proportions, are less subject to such recompositions.

Similar results can be observed for stacks comprising layers of materials belonging to the previously-mentioned groups 14, 15, and 16.

Such results cannot be observed for stacks of layers having thicknesses greater than 5 nm. Indeed, at the interfaces between two layers, the chemical elements of the two layers form connections, possibly alloys, in the same way as if the different chemical elements were gathered in a solid block. The considered thicknesses of the stacks of the described embodiments enable a sufficient portion of each layer to be subject to this phenomenon so that, from a macroscopic point of view, the stack substantially behaves as a solid block.

Figure 4:
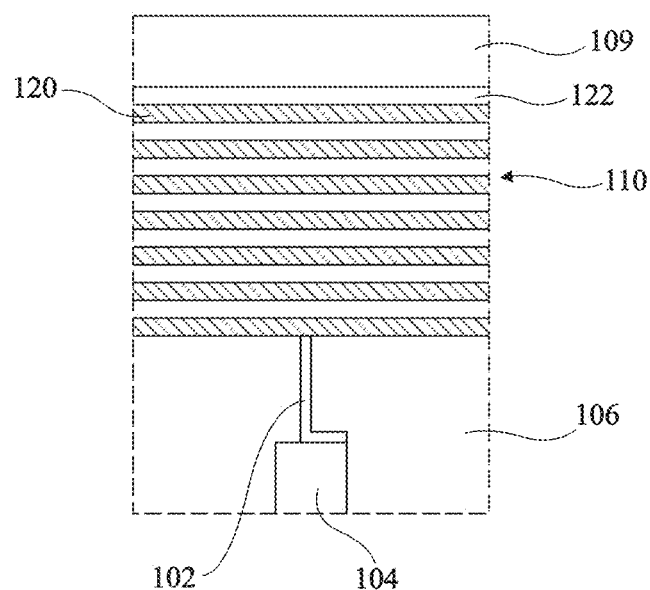
FIG. 4 is a partial simplified cross-section view of another embodiment of a storage element.

FIG. 4 is a partial simplified cross-section view of another embodiment of a storage element. More particularly, FIG. 4 shows a structure at a same manufacturing stage as structure a) of FIG. 2. The structure of FIG. 4 comprises all the elements of FIG. 2.

Stack 110 of the embodiment of FIG. 4 comprises layers 120 and 122. Layers 120 (hatched layers) are doped and layers 122 are not doped. The doping of layers 120 is preferably performed layer by layer on forming of the stack. This enables to accurately control the doping in the stack.

Layers 120 are for example doped with one or a plurality of dopants among nitrogen, carbon, and silicon.

Layers 120 are for example layers of nitrogen-doped germanium and layers 122 are for example an alloy made up of germanium, antimony, and tellurium. In this example, layers 120 are substantially identically doped.

As a variation, the stack may comprise a plurality of assemblies of layers made of different materials, where each assembly may be doped or non-doped. For example, the high portion of stack 110 may be doped with carbon, to decrease the risk of interdiffusion between the material of layer 109 and the material of the upper layer of stack 110, and the lower portion may be doped with nitrogen to increase the crystallization temperature.

Such a layer-by-layer doping has the advantage of allowing the interaction of the dopants with certain elements of the stack, but not with all of them, while keeping a stack having a uniform macroscopic behavior.

As a variation, the stack may comprise at least one assembly of layers having a gradual doping. For example, the doping may increase between the layer of said assembly closest to the lower layer in the stack and the layer of said assembly closest to the upper layer in the stack.

Such a gradual doping has the advantage of allowing, for example, the modulation of the resistivity of the phase-change material along its height.

An advantage of the described embodiments is that the doping types described in relation with FIG. 4 cannot be obtained by co-sputtering with a standard deposition technique or by ion implantation.

An advantage of the described embodiments is that the manufacturing method adds no variability between different simultaneously-formed storage elements. The storage elements of a same memory device may thus be in a same state at the initialization, which enables to increase the efficiency of the memory.

Another advantage of the described embodiments is that the amorphous layers of first portion 110 form a thermal insulator. Indeed, the chemical elements in their amorphous state are poorer heat conductors than in their crystalline state. This thus enables to limit, on writing into such a memory cell, the loss of heat, and thus of energy, out of the second portion.

Another advantage of the described embodiments is that the amorphous layers of first portion 110 make portion 112 less subject to the recrystallization phenomenon which might cause a loss of the stored data.

Another advantage of the described embodiments is that, in a case where the temperatures of the manufacturing method cause a phase separation or a recrystallization of the layers in the stack, the size of the crystals is more homogeneous than in the case of a solid block, and thus enables to better control the crystallization dynamics.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A phase-change storage element comprising, in a first portion, a stack of amorphous layers, the thickness of each layer in the stack being smaller than or equal to 5 nm, the element comprising a second portion crossing at least certain layers in the stack, made of an alloy of at least a portion of the components of the layers in the stack;
   wherein the material of the second portion is a phase-change material.

2. The element of claim 1, wherein the stack comprises at least two assemblies of layers made of different materials.

3. The element of claim 1, wherein the layers in the stack are made of a chemical element or of an alloy of chemical elements from groups 13, 14, 15, and 16 of the periodic table of elements.

4. The element of claim 1, wherein the stack comprises an alternation of first and of second layers, the first and second layers being made of different materials.

5. The element of claim 4, wherein the first layers are made of an alloy made up of germanium, antimony, and tellurium, and the second layers are made of antimony or of germanium.

6. The element of claim 1, wherein a material of each layer in the stack has stoichiometric proportions.

7. The element of claim 1, wherein proportions of the material of the second portion are not stoichiometric.

8. The element of claim 1, wherein the first and second portions are separated by a skin made of a material of one of the layers in the stack.

9. The element of claim 1, comprising a resistive element in contact with the second portion.

10. The element of claim 1, wherein layers of an assembly of layers of the stack are doped.

11. The element of claim 10, wherein the layers of the assembly of layers are doped with one or a plurality of dopants among nitrogen, carbon, and silicon.

12. The element of claim 10, wherein the doping of the layers of the layer assembly is gradual.

13. A phase-change memory cell comprising the storage element of claim 1.

14. A method of manufacturing a storage element comprising forming a stack of amorphous layers, a thickness of each layer being smaller than or equal to 5 nm, the storage element comprising a second portion crossing at least certain layers in the stack, made of an alloy of at least part of the components of the layers in the stack;
wherein the material of the second portion is a phase-change material.

15. The method of claim 14, comprising a step of heating a portion of the stack, so that the portion comprises an alloy of at least part of the components of the layers in the stack.

16. The element of claim 11, wherein the doping of the layers of the layer assembly is gradual.

* * * * *